(12) United States Patent
Tang

(10) Patent No.: US 9,172,143 B2
(45) Date of Patent: Oct. 27, 2015

(54) ELECTRONIC DEVICE MODULE WITH INTEGRATED ANTENNA STRUCTURE, AND RELATED MANUFACTURING METHOD

(71) Applicant: Jinbang Tang, Chandler, AZ (US)

(72) Inventor: Jinbang Tang, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 539 days.

(21) Appl. No.: 13/751,318

(22) Filed: Jan. 28, 2013

(65) Prior Publication Data

US 2013/0135152 A1 May 30, 2013

Related U.S. Application Data

(62) Division of application No. 12/692,996, filed on Jan. 25, 2010, now Pat. No. 8,407,890.

(51) Int. Cl.
  *H01L 25/00* (2006.01)
  *H01Q 9/04* (2006.01)
  *H01Q 1/22* (2006.01)

(52) U.S. Cl.
  CPC .......... *H01Q 9/0407* (2013.01); *H01Q 1/2283* (2013.01); *Y10T 29/49002* (2015.01); *Y10T 29/4913* (2015.01); *Y10T 29/49016* (2015.01); *Y10T 29/49128* (2015.01); *Y10T 29/49146* (2015.01); *Y10T 29/49171* (2015.01)

(58) Field of Classification Search
  CPC ................. H01L 2924/30107; H01L 2924/97; H01L 21/00; H01L 2224/97; H01L 23/36; H01L 23/4334
  USPC ........................................................ 257/174
  See application file for complete search history.

(56) References Cited

U.S. PATENT DOCUMENTS

| | | | |
|---|---|---|---|
| 6,849,936 B1 * | 2/2005 | Berman et al. | 257/679 |
| 7,154,432 B2 | 12/2006 | Nagausaku et al. | |
| 2009/0057849 A1 | 3/2009 | Tang et al. | |
| 2009/0075428 A1 | 3/2009 | Tang et al. | |
| 2011/0181488 A1 * | 7/2011 | Tang | 343/873 |
| 2012/0182066 A1 * | 7/2012 | Merkle et al. | 327/564 |

OTHER PUBLICATIONS

Pfeiffer, U., et al., A 60GHz radio chipset fully-integrated in a low-cost packaging technology, Electronic Components and Technology Conference Proceedings, 2006.
Antenova Ltd., Antenova Announces Availblity of GPS RADIONOVA RF Antenna Module, Feb. 12, 2007.
USPTO "Notice of Allowance" mailed Dec. 17, 2012; U.S. Appl. No. 12/692,996, filed Jan. 25, 2010.

* cited by examiner

*Primary Examiner* — Matthew W Such
*Assistant Examiner* — Krista Soderholm
(74) *Attorney, Agent, or Firm* — Ingrassia Fisher & Lorenz, P.C.

(57) ABSTRACT

An electronic device module as described herein includes an electronic device package having device contacts. The electronic device package is fixed within encapsulating material, along with an electrically conductive ground layer. The ground layer has a device opening in which the electronic device package resides, and the ground layer also has an antenna opening spaced apart from the device opening. The device contacts and one side of the ground layer correspond to a first surface, and a patch antenna element overlies the first surface. The antenna element is coupled to the electronic device package, and a projection of the patch antenna element onto the first surface resides within the antenna opening. Also provided are methods for manufacturing such an electronic device module.

20 Claims, 9 Drawing Sheets

ELECTRONIC DEVICE MODULE WITH INTEGRATED ANTENNA STRUCTURE, AND RELATED MANUFACTURING METHOD

CROSS-REFERENCE TO RELATED APPLICATION

This application is a divisional of U.S. patent application Ser. No. 12/692,996, filed Jan. 25, 2010.

TECHNICAL FIELD

Embodiments of the subject matter described herein relate generally to electronic device modules that include an embedded, integrated, or incorporated electronic device package. More particularly, embodiments of the subject matter relate to an electronic device module having an embedded ground plane element that serves as an antenna component.

BACKGROUND

Integrated circuits, electronic devices, and related manufacturing techniques are well known. Common applications include, for example, radar sensors, radio frequency (RF) radios, and global positioning system (GPS) receivers. In a typical deployment, an RF antenna structure is formed as one distinct and physically separate component, while the associated receiver, sensor, or radio circuit is formed as another distinct and physically separate device. The available technology for implementing a sensor/radio in a single package or module is somewhat complicated and costly, often requiring several different assembly or integration processes.

One technique for increasing density of functionality is to include multiple elements, such as integrated circuit packages, into one device module. Such an implementation is an alternative to simply placing all of the functionality on a single integrated circuit because there are types of integrated circuits and semiconductor components that are difficult to make on the same integrated circuit, or at least difficult to optimize on the same integrated circuit. For example, radio frequency (RF) circuits typically require a different fabrication process than logic circuits. Moreover, logic and analog circuits may need to be optimized differently and, therefore, may require different fabrication processes.

One technique for placing multiple elements in the same device module is sometimes referred to as redistributed chip packaging (RCP) which typically uses an organic fill around the components and builds interconnect layers on a top side of the package where external contacts are also formed. The components can be connected from one side of the fabricated package.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology may also be used in the following description for the purpose of reference only, and thus are not intended to be limiting. Such terminology may include the words specifically mentioned above, derivatives thereof, and words of similar import. Similarly, the terms "first," "second" and other such numerical terms referring to structures do not imply a sequence or order unless clearly indicated by the context.

FIGS. 1-9 are cross sectional and other views that illustrate an exemplary embodiment of a manufacturing process for an electronic device module that includes at least one electronic device package and an antenna component that is suitably configured to send and/or receive RF signals. The antenna component is coupled to the at least one electronic device package, which can include a radio circuit, a wireless transceiver, an RF receiver, an RF transmitter an RF transceiver, or the like. For the sake of brevity, conventional techniques related to semiconductor device fabrication and packaging may not be described in detail herein. Moreover, the various tasks and process steps described below may be incorporated into a more comprehensive procedure or process having additional steps or functionality not described in detail herein. In particular, various steps in the manufacture of electronic device packages, electronic devices, and device modules are well known and so, in the interest of brevity, many conventional steps will only be mentioned briefly herein or will be omitted entirely without providing the well known process details.

Figure 1:
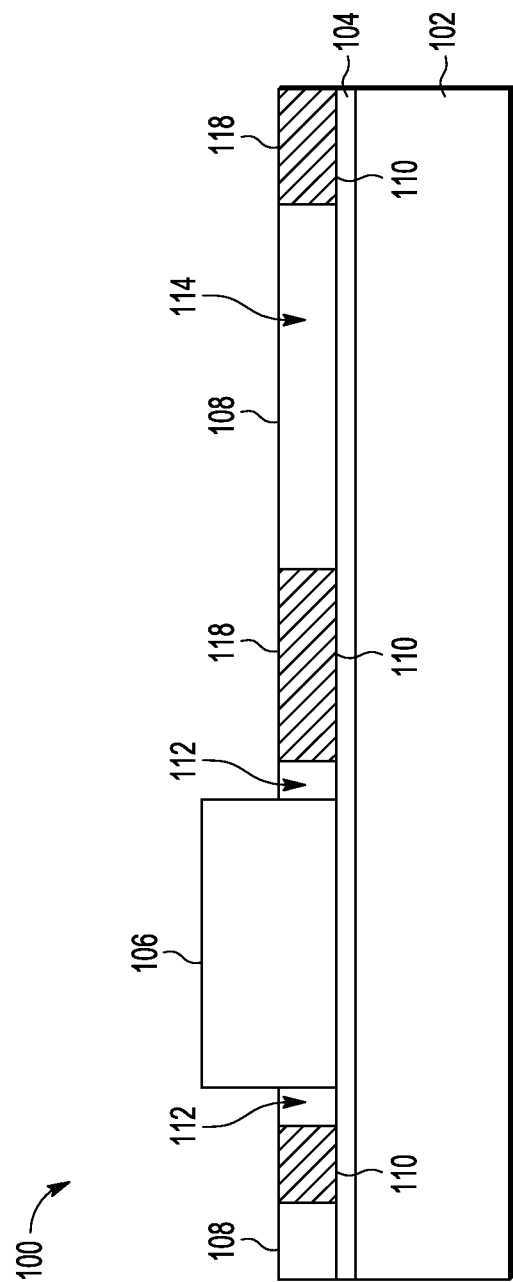
FIG. 1 is a cross sectional view of an exemplary electronic device module at a particular stage of a manufacturing process according to an embodiment of the invention.
Figure 2:
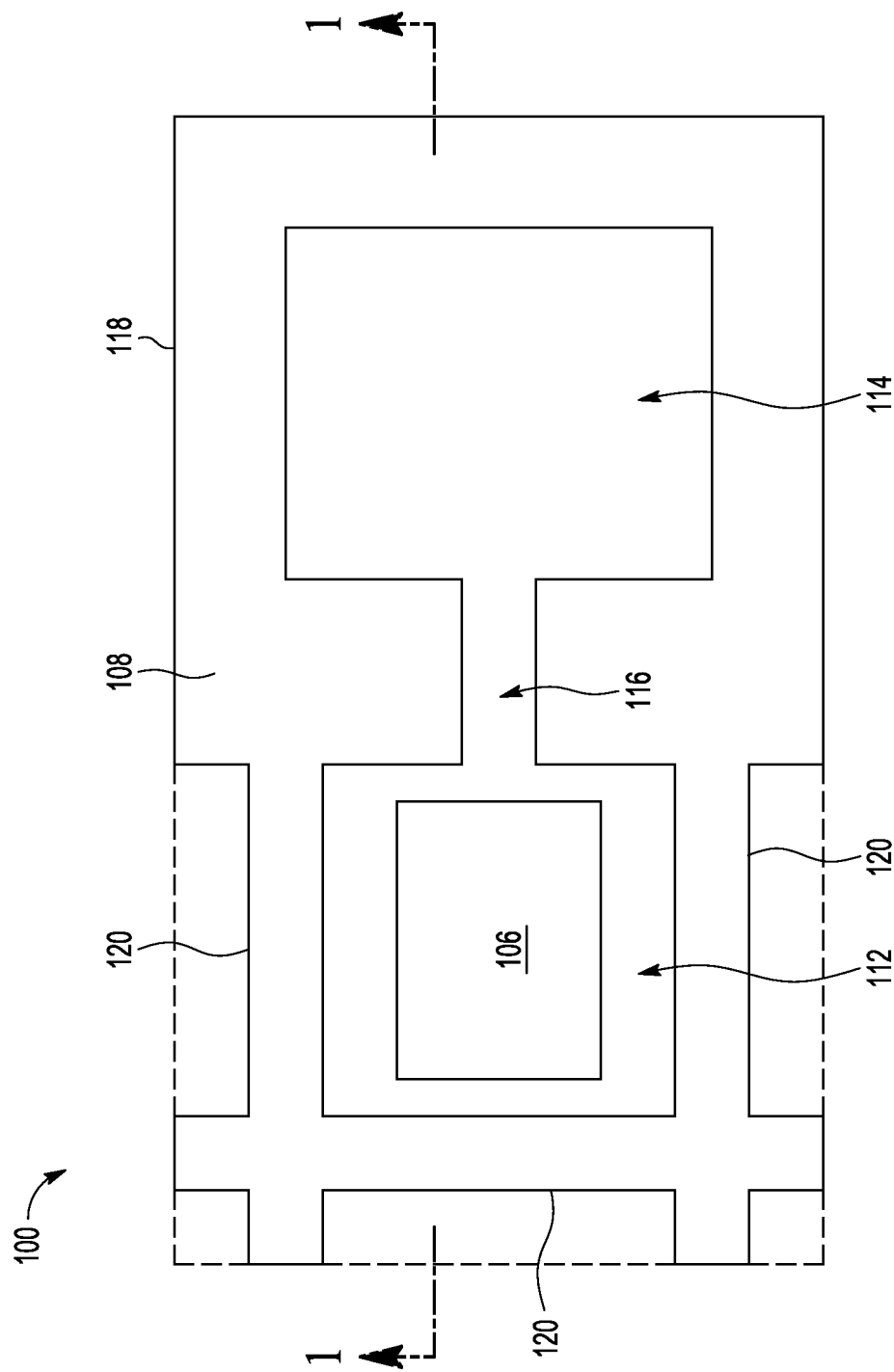
FIG. 2 is a top view of an exemplary ground element used in the electronic device module shown in FIG. 1.

FIG. 1 is a cross sectional view of an electronic device module 100 at an intermediate stage of an overall manufacturing process. FIG. 1 depicts a temporary carrier substrate 102, an adhesive element (or material) 104, an electronic device package 106, and a ground element 108 in an assembled state. FIG. 2 is a top view of the electronic device module 100, showing the patterned layout of the ground element 108. FIG. 1 corresponds to a cross sectional view taken from line 1-1 in FIG. 2. It should be appreciated that the figures depict only one electronic device module 100, which may correspond to one of many "cells" that are fabricated together from one wafer or substrate. In this regard, the overall rectangular outline depicted in FIG. 2 (including the imaginary dashed lines) may represent a single cell. This cell can be repeated many times on a wafer or substrate and, after wafer-scale fabrication is complete, the individual cells can be diced or otherwise separated as needed.

Referring back to FIG. 1, the temporary carrier substrate 102 provides mechanical support during the manufacturing process. FIG. 1 depicts the state of the electronic device module 100 after the electronic device package 106 and the ground element 108 have been affixed, attached, glued, or adhered to the temporary carrier substrate 102. The adhesive element 104 is used to attach the electronic device package 106 and the ground element 108 to the temporary carrier substrate 102. The adhesive element 104 could be, for example, double-sided tape, a glue, a bonding material, or the like (in preferred embodiments, the adhesive element 104 is realized as double-sided tape). In FIG. 1, the lowermost surfaces and/or features of the electronic device package 106 and the ground element 108 correspond to the uppermost surface of the adhesive element 104, and this common surface may be referred to here as a device mounting surface 110 (or a package reference surface).

The electronic device package 106 may be, for example, an integrated circuit package having the desired functionality and performance requirements. In certain embodiments, the electronic device package 106 is configured as a millimeter wave sensor, radio, or receiver chip. In particular embodiments, the electronic device package 106 is realized as a radar sensor that supports millimeter wave frequencies within the range of about 30 to 100 GHz, and, preferably, tuned to about 77 GHz. Moreover, the electronic device package 106 includes a number of device contacts, conductive pads, input/output pins, and/or ports that serve as electrical interconnection points for supply voltages, input/output signals, bias signals, control signals, RF signals, antenna feed signals, etc. For this exemplary embodiment, the electronic device package 106 includes one or more device contacts that reside on its bottom surface (i.e., the device contacts are located at the surface of the electronic device package 106 that faces the adhesive element 104). These device contacts are hidden from view in FIG. 1.

The ground element 108 is formed from an electrically conductive material or composition. In certain embodiments, the ground element 108 is formed from a highly conductive metal such as copper. In practice, the ground element 108 can be formed from a thin sheet or layer having a typical thickness between about 50 to 200 micrometers (µm). As will become apparent from the following description, the ground element 108 serves as a ground plane or layer for the electronic device module 100 and/or for certain components, features, or elements of the electronic device module 100. Referring to FIG. 2, the illustrated and non-limiting embodiment of the ground element 108 has defined therein: a device opening 112 for the electronic device package 106; an antenna opening 114 for accommodating an RF antenna element; and an antenna feed opening 116 for an antenna feed line. The antenna opening 114 is spaced apart from the device opening 112, and the antenna feed opening 116 joins the device opening 112 to the antenna opening 114, as depicted in FIG. 2. The shape and size of the device opening 112 is chosen to accommodate the electronic device package 106, which preferably resides within the device opening 112 with room to spare. In other words, after installation onto the temporary carrier substrate 102, a gap exists between the sidewalls of the electronic device package 106 and the ground element 108 (see FIG. 2).

This embodiment of the ground element 108 includes an antenna ground section 118, which generally surrounds (at least in part) the antenna opening 114. More specifically, the antenna ground section 118 includes the boundary that encircles the antenna opening 114, and it may be considered to be the reverse C-shaped feature depicted in FIG. 2. Thus, the inner boundary of the antenna ground section 118 defines the antenna opening 114 in this embodiment. The ground element 108 may also include a number of ground lines or traces 120 that are near the device opening 112. These ground traces 120 can be used to establish ground connections to the electronic device package 106 and/or to conductive plugs utilized in the electronic device module 100 (described below).

Figure 3:
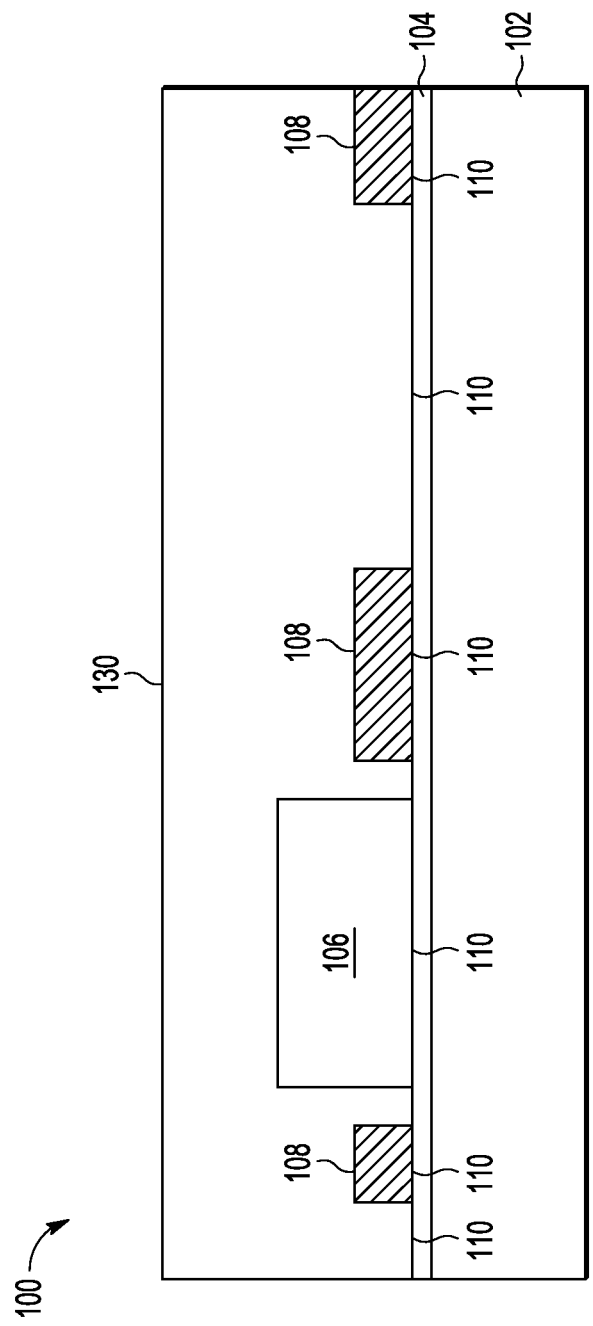
FIGS. 3-5 are cross sectional views of the electronic device module at other stages of the manufacturing process.

The manufacturing process may continue by applying a suitable encapsulating material 130 overlying the temporary carrier substrate 102, the adhesive element 104, the electronic device package 106, and the ground element 108. FIG. 3 depicts the state of the electronic device module 100 after the ground element 108 and the electronic device package 106 have been embedded in the encapsulating material 130. FIG. 3 represents a view of the electronic device module 100 along the line 1-1 shown in FIG. 2. In this regard, the encapsulating material 130 (when cured or set) fixes the electronic device package 106 and the ground element 108 in place, relative to one another and relative to the device mounting surface 110 (which now is also defined in part by the lowermost surface of the encapsulating material 130). In practice, the encapsulating material 130 is a dielectric material that can be deposited using known deposition techniques. For example, the encapsulating material 130 may include a layer of organic material, such as a polymer material, that is deposited to a thickness within the range of about 300 to 800 micrometers. As depicted in FIG. 3, the encapsulating material 130 is formed such that it fills in the gaps, recesses, and openings defined in the ground element 108, and the encapsulating material 130 is formed to a height above the device mounting surface 110 such that the encapsulating material 130 completely covers the electronic device package 106 and the ground element 108.

Figure 4:
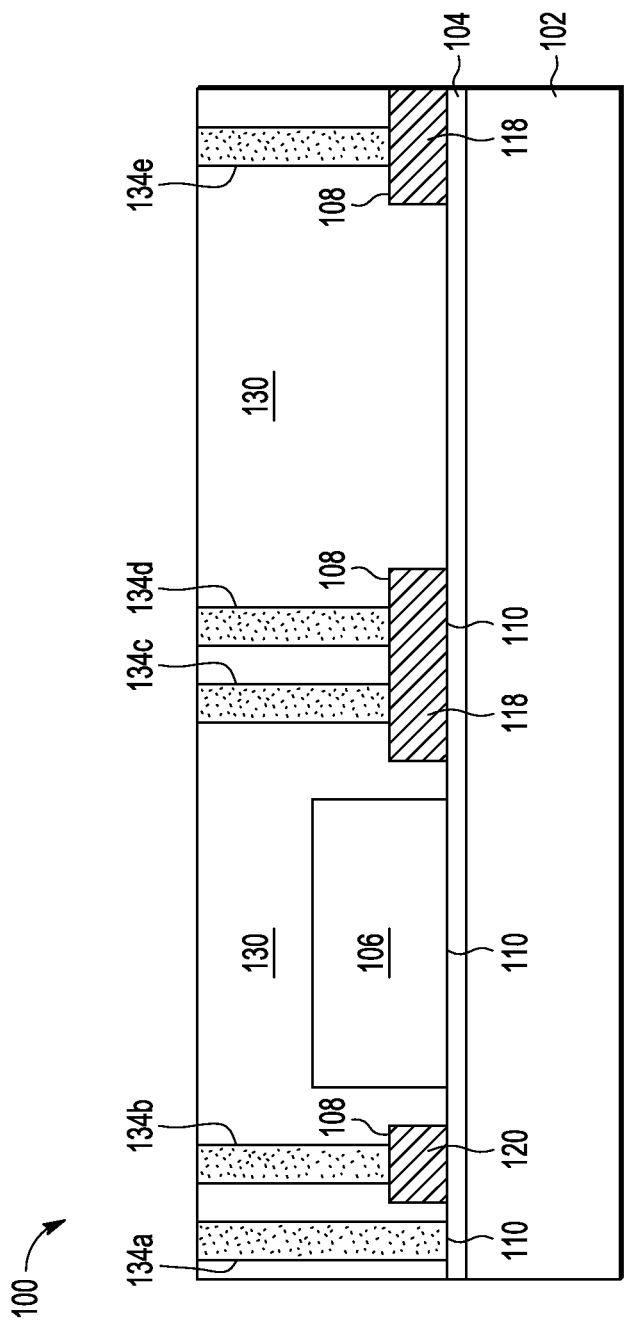

As an optional step, the formed encapsulating material 130 could be polished, grinded, sanded, or planarized if necessary to prepare it for subsequent processing. The manufacturing process may then continue by creating one or more conductive plugs in the encapsulating material 130. FIG. 4 depicts the state of the electronic device module 100 after creation of several conductive plugs 134. FIG. 4 does not necessarily correspond to a view taken from a consistent cross sectional line, and it does not correspond to the view taken along line 1-1 of FIG. 2. In other words, the conductive plugs 134 shown in FIG. 4 could be located at different cross sectional depths (they are shown together in FIG. 4 for ease of illustration and clarity of description). The conductive plugs 134 can be fabricated using various well known process techniques. For example, the encapsulating material 130 may be selectively etched (using chemical, laser, or other techniques) to form vias in the desired locations. Thereafter, the vias can be filled with an appropriate electrically conductive material, such as copper, tungsten, or the like, using a suitable metal deposition technique. In typical embodiments, the conductive plugs 134 are formed from a copper-based material.

The conductive plug 134a has a first end that terminates at the outer (upper) surface of the encapsulating material 130 and it has a second end that terminates at a location corresponding to the device mounting surface 110 (i.e., for this embodiment, the conductive plug 134a terminates at the adhesive element 104). Similarly, the conductive plug 134b extends from the top of the encapsulating material 130, but it instead terminates at one of the ground traces 120 (see FIG. 2) of the ground element 108. The conductive plugs 134c, 134d, and 134e extend from the top of the encapsulating material 130 and terminate at the antenna ground section 118 (see FIG. 2) of the ground element 108. The layout, size, location, and configuration of the conductive plugs 134 can vary as needed to accommodate the particular electronic device package 106 configuration, the interconnect architecture of the electronic device module 100, the system or subsystem interface board arrangement, and/or other practical considerations.

Figure 5:
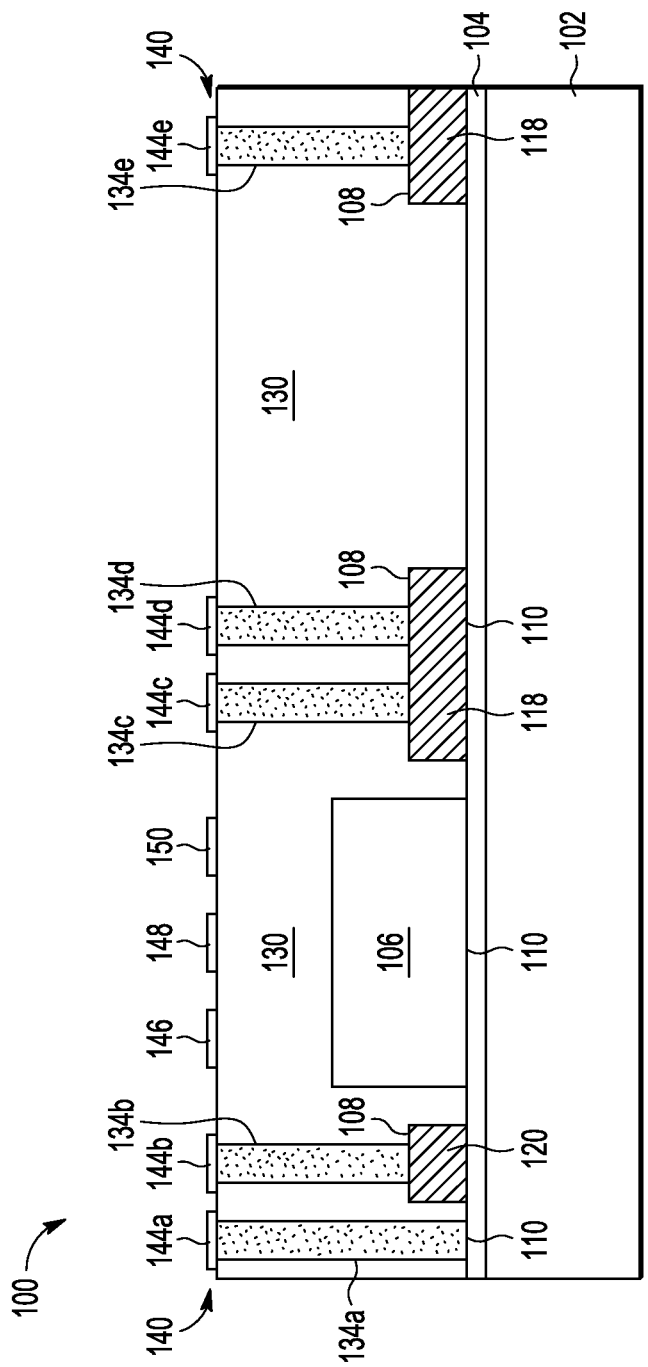

After formation of the conductive plugs 134, the encapsulating material 130 and the tips of the conductive plugs 134 could be polished, grinded, sanded, or planarized if necessary to prepare them for subsequent processing. The manufacturing process may then continue by fabricating an interface circuit structure 140 overlying at least a portion of the encapsulating material 130. FIG. 5 depicts the state of the electronic device module 100 after grinding the upper surface and after fabrication of the interface circuit structure 140, which resides on the upper surface of the encapsulating material 130. FIG. 5 does not necessarily correspond to a view taken from a consistent cross sectional line, and it does not correspond to the view taken along line 1-1 of FIG. 2. In other words, some of the features shown in FIG. 5 could be located at different cross sectional depths (they are shown together in FIG. 5 for ease of illustration and consistency with the other figures).

In this embodiment, the interface circuit structure 140 includes conductive features 144 coupled to the conductive plugs 134. The conductive features are preferably formed from an electrically conductive material or composition. In certain embodiments, the conductive features are formed from a highly conductive metal such as copper. Although not always required, each conductive plug 134 in this embodiment has a respective conductive feature 144 in the interface circuit structure 140. In this regard, a conductive feature 144*a* is electrically connected to the conductive plug 134*a*, a conductive feature 144*b* is electrically connected to the conductive plug 134*b*, a conductive feature 144*c* is electrically connected to the conductive plug 134*c*, a conductive feature 144*d* is electrically connected to the conductive plug 134*d*, and a conductive feature 144*e* is electrically connected to the conductive plug 134*e*. FIG. 5 also depicts three conductive features 146, 148, and 150 of the interface circuit structure 140; these conductive features 146, 148, and 150 may be coupled to conductive plugs that reside at different cross sectional planes and, therefore, are not visible in FIG. 5.

Figure 6:
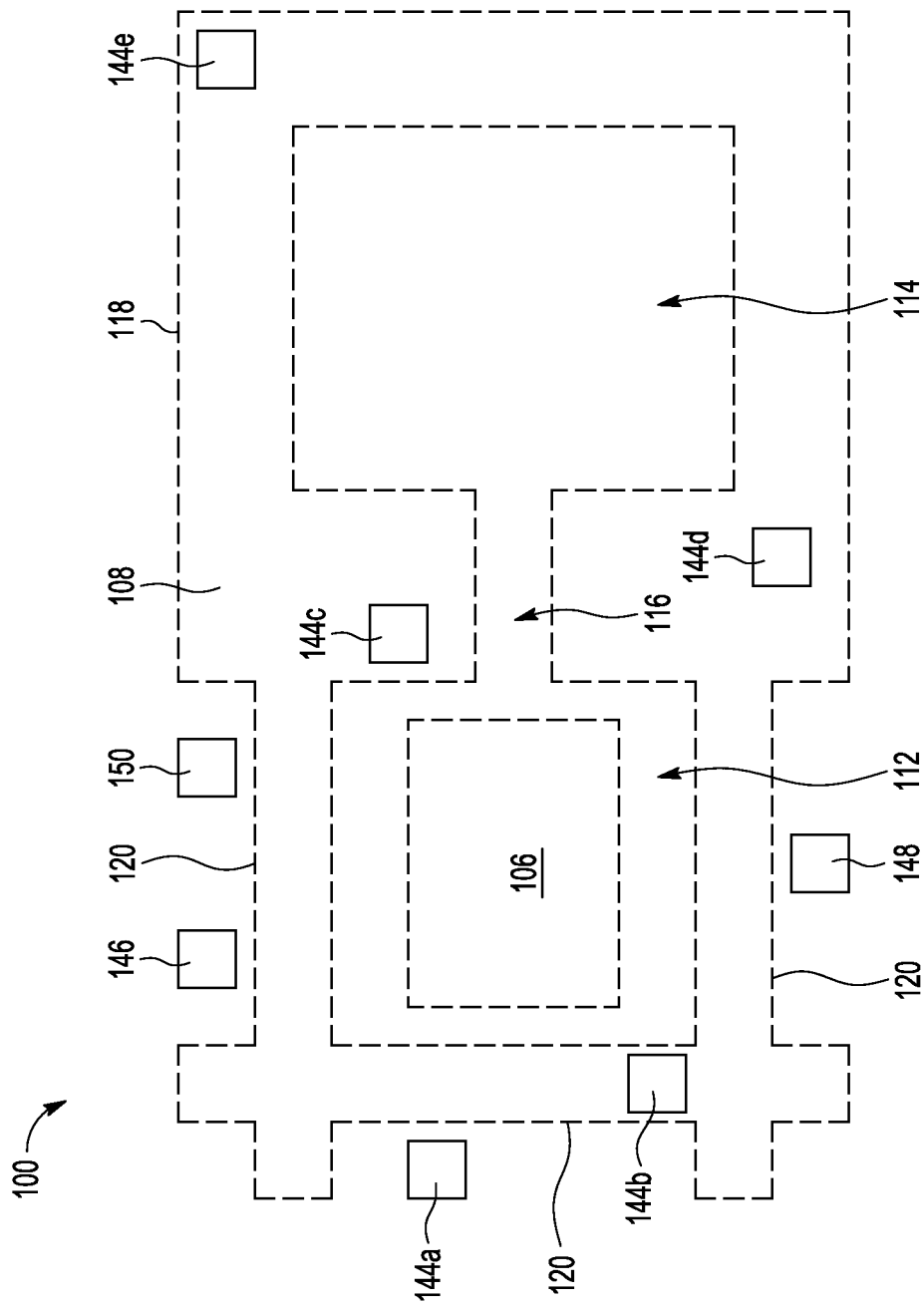
FIG. 6 is a top view of the electronic device module at the stage of the manufacturing process shown in FIG. 5.

FIG. 6 is a top view of the electronic device module 100 at the stage of the manufacturing process shown in FIG. 5. The outlines of the electronic device package 106 and the ground element 108 are depicted in dashed lines to indicate their embedded position. FIG. 6 depicts the respective locations of the conductive features 144, 146, 148, and 150, which are shown in the cross section view of FIG. 5. For the sake of simplicity and clarity, these conductive features have been depicted as conductive pads or contacts. In practice, however, the interface circuit structure 140 could include other conductive features, such as conductive lines, traces, RF tuning elements, or the like. Moreover, these conductive features have been depicted as though they all reside on a common layer. In practice, the interface circuit structure 140 could be implemented as a multilayer structure having any number of conductive material layers and any number of intervening dielectric or insulating layers formed in a stacked arrangement. In this regard, the conductive plugs 134 could be "extended" using additional conductive plugs formed through one or more dielectric layers of the interface circuit structure 140 (which overlies the encapsulating material 130) to accommodate electrical connection to conductive features that reside on different conductive layers.

Figure 7:
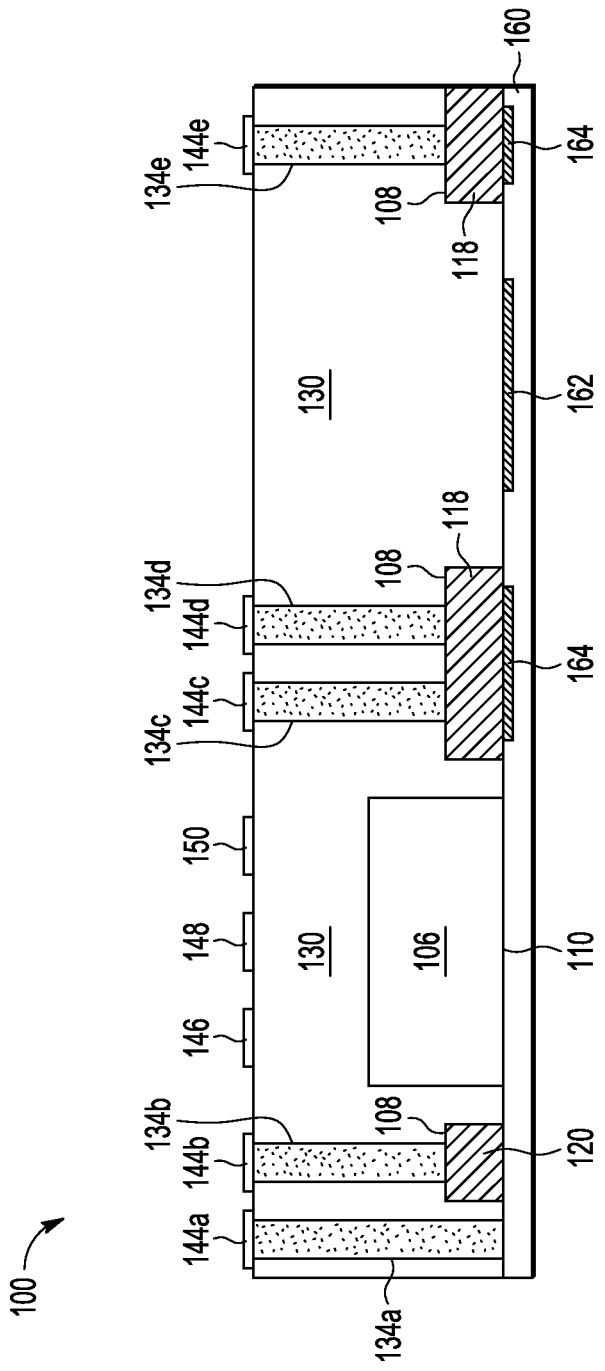
FIG. 7 is a cross sectional view of the electronic device module at another stage of the manufacturing process.
Figure 8:
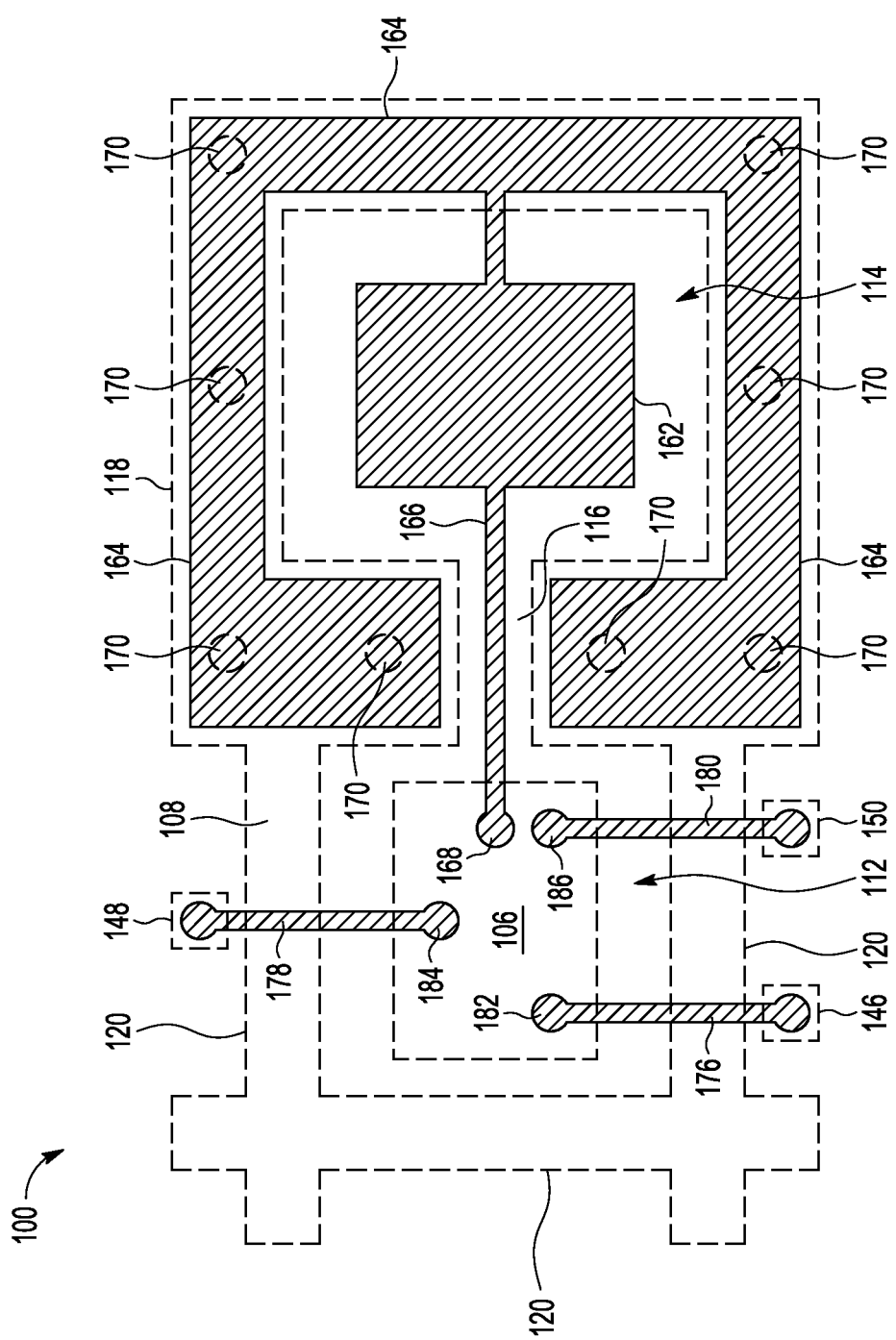
FIG. 8 is a bottom view of the electronic device module at the stage of the manufacturing process shown in FIG. 7.

After the interface circuit structure 140 has been created, the temporary carrier substrate 102 and the adhesive element 104 are removed to expose the device mounting surface 110. This removal procedure exposes one side of the ground element 108 and device contacts of the electronic device package 106. The electronic device module 100 (and, in particular, the exposed device mounting surface 110) is cleaned and otherwise prepared for further processing. This exemplary manufacturing process continues by forming an antenna circuit structure 160 overlying at least a portion of the device mounting surface 110. More specifically, the antenna circuit structure 160 overlies at least some of the ground element 108 and at least some of the device contacts. In certain embodiments, the antenna circuit structure 160 is formed overlying most if not all of the device mounting surface 110, as depicted in FIG. 7. Note that FIG. 7 does not necessarily correspond to a view taken from a consistent cross sectional line, and it does not necessarily correspond to the view taken along line 1-1 of FIG. 2. In other words, some of the features shown in FIG. 7 could be located at different cross sectional depths (they are shown together in FIG. 7 for ease of illustration and consistency with the other figures). Moreover, for consistency with the preceding figures, the electronic device module 100 is shown with the antenna circuit structure 160 at the bottom. In practice, however, the electronic device module 100 would be flipped over to accommodate fabrication of the antenna circuit structure 160. FIG. 8 is a bottom view of the electronic device module 100 at the stage of the manufacturing process shown in FIG. 7. The outlines of the electronic device package 106 and the ground element 108 are depicted in dashed lines to indicate their position below the antenna circuit structure 160. Moreover, FIG. 8 has been simplified to remove some of the features that appear in FIG. 6 and FIG. 7.

The antenna circuit structure 160 can be fabricated using one or more layers of electrically conductive material (such as copper or other metals) and, if necessary, one or more layers of dielectric material. For example, a thin layer of dielectric layer could be formed overlying the exposed device mounting surface 110 before forming a metal layer overlying that dielectric layer. Thin conductive plugs could be used to electrically connect features formed in the first metal layer of the antenna circuit structure 160 with conductive features that reside at the device mounting surface (e.g., device contacts of the electronic device package 106, areas of the ground element 108, conductive plugs formed in the encapsulating material 130, etc.). In alternate implementations, it may be possible to selectively form a desired pattern of conductive features directly on the exposed device mounting surface 110. Thus, the antenna circuit structure 160 may have conductive features that all reside on the same material (e.g., metal) layer, or the antenna circuit structure 160 could be implemented as a multilayer structure having any number of conductive material layers and any number of intervening dielectric or insulating layers formed in a stacked arrangement. In this regard, the antenna circuit structure 160 could also include conductive plugs or interconnects that traverse one or more dielectric layers.

The exemplary embodiment of the electronic device module 100 includes an integrated antenna structure having antenna components that are realized in the antenna circuit structure 160. The illustrated embodiment, which is not intended to be limiting or exhaustive of potential implementations, includes a patch antenna signal element 162 and a patch antenna ground element 164 that surrounds substantially all of the antenna signal element 162. The antenna signal element 162 and the antenna ground element 164 can be formed from the same layer of conductive material, such as copper or another metal. The antenna signal element 162 is located "in" the antenna opening 114 of the ground element 108. More specifically, the projection of the antenna signal element 162 onto the device mounting surface 110 resides within the antenna opening 114. Conversely, the projection of the antenna ground element 164 onto the device mounting surface 110 resides outside the antenna opening 114, as depicted in FIG. 8. The antenna signal element 162, the antenna ground element 164, the antenna opening 114, and the antenna ground section 118 are suitably configured such that they cooperate to form an integrated antenna for the electronic device module 100. In this regard, the particular shape, size, layout, dimensions, and electromagnetic characteristics of these features may be chosen, selected, or tuned as needed for good RF antenna performance. In particular embodiments, the antenna signal element 162, the antenna opening 114, the ground element 108, the antenna ground element 164, and the antenna ground section 118 are cooperatively shaped, sized, and tuned for operation as a millimeter wave antenna structure.

The antenna signal element 162 is coupled to the electronic device package 106 using at least one antenna feed line 166. In the illustrated embodiment, the antenna feed line 166 connects the antenna signal element 162 to a device contact 168 of the electronic device package 106. The antenna feed line 166 can be formed from the same layer of conductive material that is used to form the antenna signal element 162 and the antenna ground element 164, or it can be formed from a different conductive layer in the antenna circuit structure 160 (cooperating with a conductive plug if necessary). Referring also to FIG. 2, the antenna feed line 166 is located in the space defined by the antenna feed opening 116.

When forming the antenna circuit structure 160, the antenna ground element 164 can be coupled to the antenna ground section 118 of the ground element 108. For example, conductive ground plugs 170 may be formed between the ground element 108 and the antenna ground element 164 (see FIG. 8, which depicts the conductive ground plugs 170 in dashed lines). In certain embodiments, the conductive ground plugs 170 are formed in an intervening dielectric layer located between the antenna ground section 118 and the antenna ground element 164.

The antenna circuit structure 160 may also include one or more device signal lines, DC supply lines, conductive traces, low frequency signal transmission lines, and/or other features that may be unrelated to the RF operation of the antenna per se. Such "noncritical" features and items are located at or near the device side of the electronic device module 100 such that they do not interfere with the RF performance of the antenna. In this regard, FIG. 8 shows three device signal lines 176, 178, and 180. The device signal line 176 is coupled between a respective device contact 182 of the electronic device package 106 and the conductive feature 146, which in turn may be coupled to a conductive plug formed in the encapsulating material 130. The device signal line 178 is coupled between a respective device contact 184 of the electronic device package 106 and the conductive feature 148, which in turn may be coupled to another conductive plug formed in the encapsulating material 130. Similarly, the device signal line 180 is coupled between a respective device contact 186 of the electronic device package 106 and the conductive feature 150, which in turn may be coupled to yet another conductive plug formed in the encapsulating material 130.

After the antenna circuit structure 160 has been created, the manufacturing process may continue by forming a protection layer overlying at least the device contact area of the electronic device package 106. The protection layer (which is not separately shown) may serve as an electrical insulator/shield and/or an environmental shield for certain features and components of the electronic device module 100. In this regard, the protection layer is realized using a dielectric material or sheet. In certain embodiments, the antenna circuit structure 160 is formed with an antenna access opening overlying the antenna signal element 162, such that at least a portion of the antenna signal element 162 is uncovered and exposed through the antenna access opening. In such embodiments, the protection layer can be selectively formed such that the antenna access opening is preserved. The antenna access opening may be desirable in certain implementations to improve RF performance of the embedded antenna structure.

Thereafter, the electronic device module 100 can be separated (diced) to release it from neighboring cells, cleaned, and otherwise prepared for system or subsystem level assembly. In this regard, a plurality of sub-modules could be fabricated on a common substrate having a ground plane that includes a plurality of device openings for a plurality of electronic device packages, along with a plurality of antenna ground sections. During fabrication in the manner described above, a plurality of antenna circuit structures are created (with a corresponding plurality of antenna signal elements that cooperate with respective antenna ground sections). Thus, a plurality of integrated antennas can be fabricated on a single substrate if so desired. Dicing of the electronic device module 100 results in the separation into different sub-modules, where each sub-module includes at least one electronic device package, at least one antenna ground section, and at least one antenna circuit structure.

Figure 9:
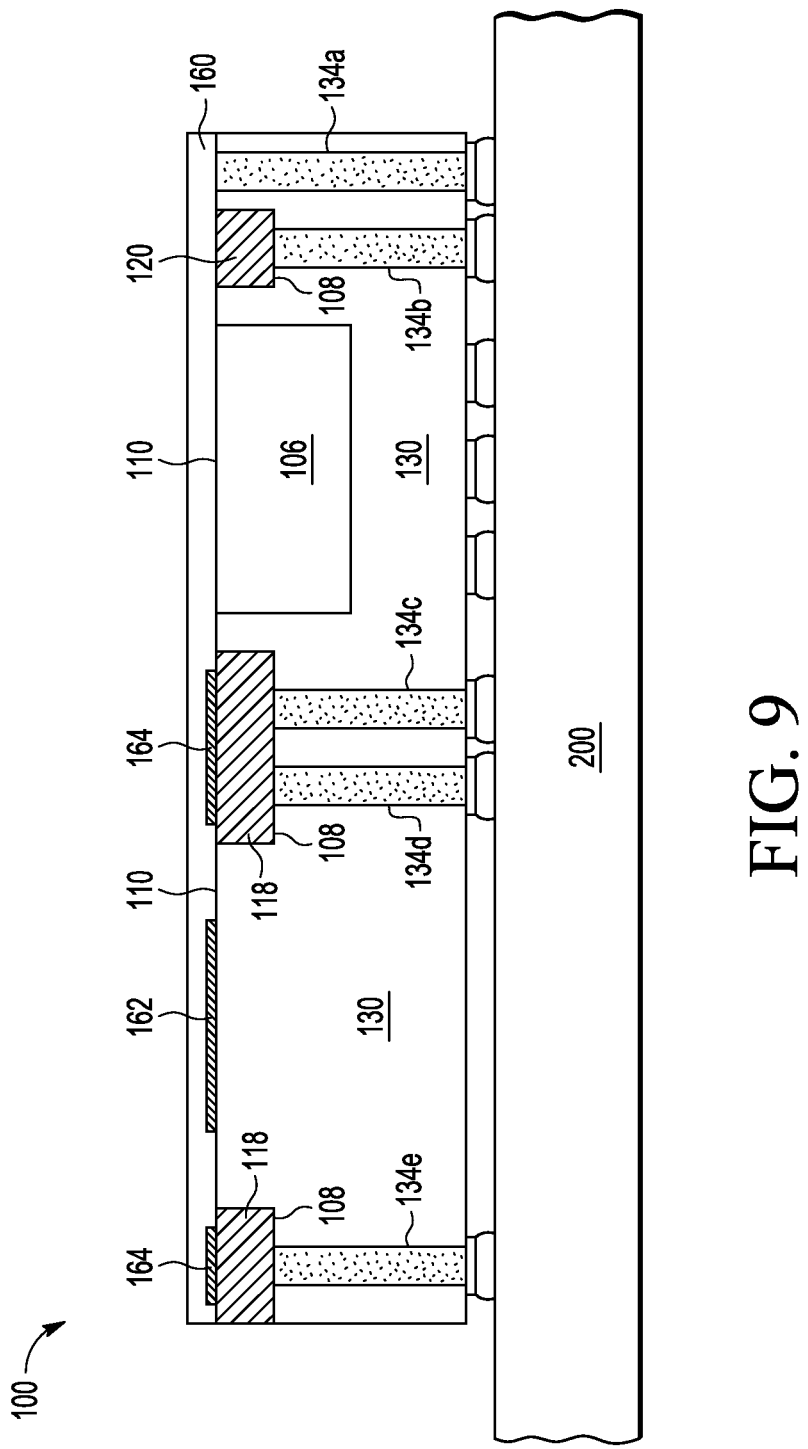
FIG. 9 is a cross sectional view of the fabricated electronic device module after it has been mounted to an interface board.

For example, the electronic device module 100 could be mounted to a system or subsystem circuit board, interface board, interconnect architecture, or the like. In this regard, FIG. 9 is a cross sectional view of the electronic device module 100 after it has been mounted to an interface board 200. FIG. 9 does not necessarily correspond to a view taken from a consistent cross sectional line, and it does not correspond to the view taken along line 1-1 of FIG. 2. In other words, some of the features shown in FIG. 9 could be located at different cross sectional depths (they are shown together in FIG. 9 for ease of illustration and consistency with the other figures). As depicted in FIG. 9, the conductive features 144, 146, 148, and 150 (and possibly others that are not shown) can be used to establish electrical and physical connections with the interface board 200. In practice, conventional soldering, wire bonding, ball grid array, and other interconnection technologies could be employed to mount the electronic device module onto the interface board 200.

In summary, systems, devices, and methods configured in accordance with exemplary embodiments relate to:

A method of fabricating an electronic device module. The method involves: attaching an electronic device package to a temporary carrier structure; affixing an electrically conductive ground element to the temporary carrier structure, the ground element having defined therein a device opening for the electronic device package and an antenna opening; applying an encapsulating material overlying the temporary carrier structure, the electronic device package, and the ground element; thereafter removing the temporary carrier structure to create a device mounting surface, wherein the ground element and device contacts of the electronic device package are exposed at the device mounting surface; and thereafter forming an antenna circuit structure overlying the ground element and the device contacts, the antenna circuit structure comprising a patch antenna signal element, wherein a projection of the patch antenna signal element onto the device mounting surface resides within the antenna opening. In certain embodiments, the forming step forms the antenna circuit structure with an antenna feed line coupled between the patch antenna signal element and one of the device contacts of the electronic device package. In some embodiments, the forming step forms the antenna circuit structure with a patch antenna ground element, wherein a projection of the patch antenna ground element onto the device mounting surface resides outside the antenna opening. In such embodiments, the forming step may form the antenna circuit structure with conductive plugs between the ground element and the patch antenna ground element. In certain embodiments, the forming step forms the antenna circuit structure with a device signal line coupled between one of the device contacts of the electronic device package and a conductive plug formed in the encapsulating material. In some embodiments, the method further involves: creating a conductive plug in the encapsulating material, the conductive plug terminating at the ground element; and fabricating an interface circuit structure overlying the encapsulating material, the interface circuit structure comprising a conductive feature coupled to the conductive plug. In certain embodiments, the method further involves: creating a conductive plug in the encapsulating material, the conductive plug terminating at a location corresponding to the device mounting surface; and fabricating an interface circuit structure overlying the encapsulating material, the interface circuit structure comprising a conductive feature coupled to the conductive plug. In some embodiments, the forming step forms the antenna circuit structure with an antenna access opening, and wherein at least a portion of the patch antenna signal element is exposed through the antenna access opening. In some embodiments, the method further involves forming a protection layer overlying at least the device contacts of the electronic device package.

A method of forming an electronic device module, which involves: creating an electrically conductive ground plane, the ground plane comprising a device opening for an electronic device package, and the ground plane comprising an antenna ground section; embedding the ground plane and the electronic device package in encapsulating material such that device contacts of the electronic device package and a first side of the ground plane reside at a device mounting surface; and thereafter forming an antenna circuit structure overlying the device mounting surface, the antenna circuit structure comprising an antenna signal element that cooperates with the antenna ground section to form an integrated antenna for the electronic device module. In certain embodiments, the creating step creates the ground plane with an antenna opening, and the forming step forms a patch antenna signal element, wherein a projection of the patch antenna signal element onto the device mounting surface resides within the antenna opening. In some embodiments, the method further involves: providing a temporary carrier structure; attaching the electronic device package to the temporary carrier structure; and affixing the ground plane to the temporary carrier structure; wherein the embedding step comprises applying the encapsulating material overlying the temporary carrier structure, the electronic device package, and the ground plane. In such embodiments, the method may further involve removing the temporary carrier structure prior to forming the antenna circuit structure. In such embodiments, the forming step could form the antenna circuit structure with an antenna feed line that couples the antenna signal element to one of the device contacts of the electronic device package. In certain embodiments, the forming step forms the antenna circuit structure with an antenna ground element that is coupled to the antenna ground section of the ground plane. In some embodiments, the method further involves: creating a conductive plug in the encapsulating material, the conductive plug terminating at the ground plane; and fabricating an interface circuit structure overlying the encapsulating material, the interface circuit structure comprising a conductive feature coupled to the conductive plug. In certain embodiments, the method further involves: creating a conductive plug in the encapsulating material, the conductive plug terminating at the device mounting surface; and fabricating an interface circuit structure overlying the encapsulating material, the interface circuit structure comprising a conductive feature coupled to the conductive plug. In some embodiments, the ground plane includes a second device opening for a second electronic device package, and a second antenna ground section, the embedding step embeds the ground plane, the electronic device package, and the second electronic device package in the encapsulating material, and the forming step forms a second antenna circuit structure comprising a second antenna signal element that cooperates with the second antenna ground section to form a second integrated antenna. For such embodiments, the method may further involve separating the electronic device module into different sub-modules, wherein a first sub-module includes the electronic device package, the antenna ground section, and the antenna circuit structure, and wherein a second sub-module includes the second electronic device package, the second antenna ground section, and the second antenna circuit structure.

An electronic device module, including: an electronic device package having device contacts, the electronic device package fixed within encapsulating material; an electrically conductive ground layer fixed within the encapsulating material, the ground layer having a device opening in which the electronic device package resides, and the ground layer having an antenna opening spaced apart from the device opening, wherein the device contacts and one side of the ground layer correspond to a first surface; and a patch antenna element overlying the first surface and coupled to the electronic device package, wherein a projection of the patch antenna element onto the first surface resides within the antenna opening. In certain embodiments, the patch antenna element, the ground layer, and the antenna opening are cooperatively shaped, sized, and tuned for operation as a millimeter wave antenna structure. Some embodiments of the electronic device module also include a conductive plug formed in the encapsulating material, the conductive plug having a first end that terminates at the ground layer, and the conductive plug having a second end that terminates at an outer surface of the encapsulating material.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electronic device module comprising:
   an electronic device package having device contacts, the electronic device package fixed within encapsulating material;
   an electrically conductive ground layer fixed within the encapsulating material, the ground layer having a device opening in which the electronic device package resides, and the ground layer having an antenna opening spaced apart from the device opening, wherein the device contacts and one side of the ground layer correspond to a first surface; and a patch antenna element overlying the first surface and coupled to the electronic device package, wherein a projection of the patch antenna element onto the first surface resides within the antenna opening.

2. The electronic device module of claim 1, wherein the patch antenna element, the ground layer, and the antenna opening are cooperatively shaped, sized, and tuned for operation as a millimeter wave antenna structure.

3. The electronic device module of claim 1, further comprising a conductive plug in the encapsulating material, the conductive plug having a first end that terminates at the ground layer, and the conductive plug having a second end that terminates at an outer surface of the encapsulating material.

4. The electronic device module of claim 1, further comprising an antenna feed line coupled between the patch antenna element and one of the device contacts of the electronic device package.

5. The electronic device module of claim 1, further comprising a patch antenna ground element, wherein a projection of the patch antenna ground element onto the first surface resides outside the antenna opening.

6. The electronic device module of claim 5, further comprising a conductive plug in the encapsulating material between the ground layer and the patch antenna ground element.

7. The electronic device module of claim 1, further comprising:
a conductive plug in the encapsulating material; and
a device signal line coupled between one of the device contacts of the electronic device package and the conductive plug.

8. The electronic device module of claim 1, further comprising:
a conductive plug in the encapsulating material; and
an interface circuit structure overlying the encapsulating material, wherein the interface circuit structure comprises a conductive feature coupled to the conductive plug.

9. The electronic device module of claim 1, further comprising:
a conductive plug in the encapsulating material, the conductive plug terminating at a location corresponding to a device mounting surface; and
an interface circuit structure overlying the encapsulating material, wherein the interface circuit structure comprises a conductive feature coupled to the conductive plug.

10. The electronic device module of claim 1, further comprising a protection layer overlying at least the device contacts of the electronic device package.

11. An electronic device module comprising:
an electronic device package having device contacts that reside at a device mounting surface;
an electrically conductive ground element having one side that corresponds to the device mounting surface, the electrically conductive ground element comprising:
an antenna ground section that defines an antenna opening;
ground traces that define a device opening for the electronic device package; and
an antenna feed opening that joins the device opening to the antenna opening;

encapsulating material overlying the electronic device package and the electrically conductive ground element, the encapsulating material having a surface that corresponds to the device mounting surface; and an antenna circuit structure formed on the device mounting surface, the antenna circuit structure comprising:
a patch antenna signal element, wherein a projection of the patch antenna signal element onto the device mounting surface resides within the antenna opening; and
an antenna feed line coupled between the patch antenna signal element and one of the device contacts of the electronic device package, wherein the antenna feed line is located in the space defined by the antenna feed opening.

12. The electronic device module of claim 11, wherein the patch antenna signal element, the ground element, and the antenna feed opening are cooperatively shaped, sized, and tuned for operation as a millimeter wave antenna structure.

13. The electronic device module of claim 11, further comprising:
a conductive plug in the encapsulating material, the conductive plug having a first end that terminates at the ground element, and the conductive plug having a second end that terminates at an outer surface of the encapsulating material; and
a conductive contact electrically connected to the second end of the conductive plug.

14. The electronic device module of claim 11, wherein a projection of the antenna ground section onto the device mounting surface resides outside the antenna opening.

15. The electronic device module of claim 11, further comprising:
a conductive plug in the encapsulating material, the conductive plug having an end that terminates at an outer surface of the encapsulating material;
a device signal line of the antenna circuit structure, the device signal line coupled between one of the device contacts of the electronic device package and the conductive plug; and
a conductive contact electrically connected to the end of the conductive plug.

16. The electronic device module of claim 11, further comprising a protection layer overlying at least the device contacts of the electronic device package.

17. An electronic device module comprising:
an electronic device package having device contacts that reside at a device mounting surface;
an electrically conductive ground element having one side that corresponds to the device mounting surface, the electrically conductive ground element comprising:
an antenna opening defined therein; and
a device opening defined therein
encapsulating material overlying the electronic device package and the electrically conductive ground element, the encapsulating material having a surface that corresponds to the device mounting surface;
an antenna circuit structure formed on the device mounting surface, the antenna circuit structure comprising:
an antenna signal element, wherein a projection of the antenna signal element onto the device mounting surface resides within the antenna opening; and an antenna ground element that surrounds substantially all of the antenna signal element, wherein a projection of the antenna ground element onto the device mounting surface resides outside the antenna opening, and wherein the antenna ground element is coupled to the electrically conductive ground element.

18. The electronic device module of claim 17, further comprising:
- a conductive plug in the encapsulating material, the conductive plug having a first end that terminates at the electrically conductive ground element, and the conductive plug having a second end that terminates at an outer surface of the encapsulating material; and
- a conductive contact electrically connected to the second end of the conductive plug.

19. The electronic device module of claim 17, further comprising:
- a conductive plug in the encapsulating material, the conductive plug having an end that terminates at an outer surface of the encapsulating material;
- a device signal line of the antenna circuit structure, the device signal line coupled between one of the device contacts of the electronic device package and the conductive plug; and
- a conductive contact electrically connected to the end of the conductive plug.

20. The electronic device module of claim 17, further comprising a protection layer overlying at least the device contacts of the electronic device package.

* * * * *